(12) United States Patent
Han

(10) Patent No.: US 11,308,850 B2
(45) Date of Patent: Apr. 19, 2022

(54) COMBINED DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventor: Baixiang Han, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 277 days.

(21) Appl. No.: 16/614,362

(22) PCT Filed: Nov. 8, 2019

(86) PCT No.: PCT/CN2019/116571
§ 371 (c)(1),
(2) Date: Nov. 17, 2019

(87) PCT Pub. No.: WO2020/008271
PCT Pub. Date: Nov. 19, 2020

(65) Prior Publication Data
US 2021/0358378 A1    Nov. 18, 2021

(30) Foreign Application Priority Data

May 10, 2019    (CN) .......................... 201910387016.5

(51) Int. Cl.
*G09G 3/20*    (2006.01)
*H01L 27/12*    (2006.01)

(52) U.S. Cl.
CPC ......... *G09G 3/2074* (2013.01); *H01L 27/124* (2013.01); *G09G 2300/0452* (2013.01); *G09G 2310/0262* (2013.01)

(58) Field of Classification Search
CPC ............... G09G 3/2074; G09G 3/2003; G09G 2300/0452; G09G 2300/0456;
(Continued)

(56) References Cited

U.S. PATENT DOCUMENTS 8,552,635 B2 * 10/2013 Kim .................... H01L 27/3216
                                                            313/504
10,141,381 B2 * 11/2018 Hsin .................. H01L 51/5203
(Continued)

FOREIGN PATENT DOCUMENTS

CN        102262854 A      11/2011
CN        204129382 U       1/2015
(Continued)

*Primary Examiner* — Vijay Shankar
(74) *Attorney, Agent, or Firm* — Soroker Agmon Nordman

(57) ABSTRACT

A combined display panel including: a first sub-screen comprising a plurality of first pixel units, each of the first pixel units comprising a first sub-pixel and a third sub-pixel; a second sub-screen comprising a plurality of second pixel units corresponding to the first pixel units, each of the second pixel units comprising a second sub-pixel; wherein the first sub-screen overlaps with the second sub-screen, each of the second pixel units is located directly above the first pixel unit corresponding thereto, a first pixel unit and a second pixel unit are stacked to form a pixel unit of the combined display panel.

20 Claims, 3 Drawing Sheets

(58) Field of Classification Search
CPC ..... G09G 2310/0262; G09G 2300/023; G09G 2300/0465; H01L 27/124; G09F 9/30; G09F 9/46
See application file for complete search history.

(56) References Cited

U.S. PATENT DOCUMENTS

| | | | |
|---|---|---|---|
| 10,658,394 B2* | 5/2020 | Zang | H01L 27/1259 |
| 10,756,142 B2* | 8/2020 | Chai | H01L 27/3288 |
| 2011/0291550 A1 | 12/2011 | Kim | |
| 2014/0292622 A1 | 10/2014 | Lee | |
| 2016/0342042 A1 | 11/2016 | Yu et al. | |
| 2017/0132970 A1 | 5/2017 | Tang | |
| 2017/0345354 A1 | 11/2017 | Kawashima et al. | |
| 2018/0175120 A1* | 6/2018 | Hsin | H01L 27/3218 |
| 2019/0326364 A1* | 10/2019 | Chai | H01L 27/3288 |
| 2020/0357843 A1* | 11/2020 | Han | H01L 33/42 |

FOREIGN PATENT DOCUMENTS

| | | |
|---|---|---|
| CN | 104407480 A | 3/2015 |
| CN | 104464541 A | 3/2015 |
| CN | 105280111 A | 1/2016 |
| CN | 106158904 A | 11/2016 |
| CN | 208142183 U | 11/2018 |
| CN | 108962964 A | 12/2018 |
| CN | 109449184 A | 3/2019 |

\* cited by examiner

COMBINED DISPLAY PANEL

CROSS REFERENCE TO RELATED APPLICATION

This application claims the priority of international Application No. PCT/CN2019/116571, filed on 2019 Nov. 8, which claims priority to Chinese Application No. 201910387016.5, filed on 2019 May 10. The entire disclosures of each of the above applications are incorporated herein by reference.

BACKGROUND OF INVENTION

Field of Invention

The present invention relates to the field of electronic display, and in particular, to a combined display panel.

Description of Prior Art

With the continuous development of display technology, users have higher requirements for resolution and service life of display panels. However, due to the process capability, as the resolution increases, aperture ratio and service life of the display panel will inevitably decrease.

Technical Problems

Referring to FIG. 1, FIG. 1 schematically shows a pixel of a display panel in the prior art. Because only a single-colored light is allowed to pass at the same time, aperture ratio of the display panel in the prior art is only about 33%, which needs to be improved.

SUMMARY OF INVENTION

The present application provides a combined display panel to increase the aperture ratio of the display panel in the prior art.

In order to solve the above problems, the present application provides a combined display panel comprising:

a first sub-screen comprising a plurality of first pixel units, each of the first pixel units comprising a first sub-pixel and a third sub-pixel;

a second sub-screen comprising a plurality of second pixel units corresponding to the first pixel units, each of the second pixel units comprising a second sub-pixel;

wherein the first sub-screen overlaps with the second sub-screen, each of the second pixel units is located directly above the first pixel unit corresponding thereto, a first pixel unit and a second pixel unit are stacked to form a pixel unit of the combined display panel;

wherein the first sub-screen comprises a first display area and a first non-display area, the first pixel units are disposed on the first display area, the first non-display area is disposed adjacent to the first display area for setting a first control circuit;

wherein the second sub-screen comprises a second display area and a second non-display area, the second pixel units are disposed on the second display area, the second non-display area is disposed adjacent to the second display area for setting a second control circuit.

According to one aspect of the application, wherein a shape and an area of each second pixel units are same as a shape and an area of each first pixel units.

According to one aspect of the application, wherein an area of the first sub-pixel is equal to an area of the third sub-pixel.

According to one aspect of the application, wherein the first sub-pixel is a red pixel, the second sub-pixel is a blue pixel, and the third sub-pixel is a green pixel.

According to one aspect of the application, wherein the first sub-screen is a top illumination display and the second sub-screen is a two-way illumination display.

According to one aspect of the application, wherein, an anode of the first sub-screen is a reflective electrode, and a cathode of the first sub-screen is a transparent electrode;

wherein an anode of the second sub-screen is a transparent electrode, and a cathode of the second sub-screen is a transparent electrode.

According to one aspect of the application, wherein the first sub-screen and the second sub-screen are rectangular;

wherein the first non-display area is disposed along a side of the first sub-screen;

wherein the second non-display area is disposed corresponding to the first non-display area along a side of the second sub-screen, the second non-display area has a same shape and area as the first non-display area.

The present invention further provides a combined display panel comprising:

a first sub-screen comprising a plurality of first pixel units, each of the first pixel units comprising a first sub-pixel and a third sub-pixel;

a second sub-screen comprising a plurality of second pixel units corresponding to the first pixel units, each of the second pixel units comprising a second sub-pixel;

wherein the first sub-screen overlaps with the second sub-screen, each of the second pixel units is located directly above the first pixel unit corresponding thereto, a first pixel unit and a second pixel unit are stacked to form a pixel unit of the combined display panel.

According to one aspect of the application, wherein a shape and an area of each second pixel units are same as a shape and an area of each first pixel units.

According to one aspect of the application, wherein an area of the first sub-pixel is equal to an area of the third sub-pixel.

According to one aspect of the application, wherein the first sub-pixel is a red pixel, the second sub-pixel is a blue pixel, and the third sub-pixel is a green pixel.

According to one aspect of the application, wherein the first sub-screen is a top illumination display and the second sub-screen is a two-way illumination display.

According to one aspect of the application, wherein an anode of the first sub-screen is a reflective electrode, and a cathode of the first sub-screen is a transparent electrode;

wherein an anode of the second sub-screen is a transparent electrode, and a cathode of the second sub-screen is a transparent electrode.

According to one aspect of the application, wherein the first sub-screen comprises a first display area and a first non-display area, the first pixel units are disposed on the first display area, the first non-display area is disposed adjacent to the first display area for setting a first control circuit;

wherein the second sub-screen comprises a second display area and a second non-display area, the second pixel units are disposed on the second display area, the second non-display area is disposed adjacent to the second display area for setting a second control circuit.

According to one aspect of the application, wherein the first sub-screen and the second sub-screen are rectangular;

wherein the first non-display area is disposed along a side of the first sub-screen;

wherein the second non-display area is disposed corresponding to the first non-display area along a side of the second sub-screen, the second non-display area has a same shape and area as the first non-display area.

According to one aspect of the application, wherein a distribution pattern of the first pixel units on the first sub-screen is axisymmetric with a distribution pattern of the second pixel units on the second sub-screen, when the first sub-screen and second sub-screen overlapping, the second sub-screen flips over the first sub-screen along a symmetry axis.

According to one aspect of the application, wherein a distribution pattern of the first pixel units on the first sub-screen is consistent with a distribution pattern of the second pixel units on the second sub-screen, when the first sub-screen and second sub-screen overlapping, the second sub-screen horizontally covers the first sub-screen.

According to one aspect of the application, wherein control signals of the first sub-screen and the second sub-screen are same, and display information received by a first pixel unit and a corresponding second pixel unit is same.

According to one aspect of the application, wherein the combined display panel further comprises a plurality of support columns between the first sub-screen and the second sub-screen.

According to one aspect of the application, wherein a material forming the support columns is a white material or a transparent material, and a surface of the support columns has a diffuse reflection structure.

Beneficial Effects

The combined display panel provided by the present application includes a corresponding first sub-screen and a second sub-screen. The first sub-screen includes a plurality of first pixel units, and the second sub-screen includes a plurality of second pixel units disposed corresponding to the first pixel units. Each of the first pixel units includes a first sub-pixel and a third sub-pixel, and each of the second pixel units includes a second sub-pixel. Each of the second pixel units is located directly above the first pixel unit corresponding thereto. With this arrangement, when the first sub-pixel or the third sub-pixel emits light, the aperture ratio of the pixel unit of the combined display panel approaches 50%. When the second sub-pixel emits light, the aperture ratio of the pixel unit of the combined display panel approaches 100%. Therefore, the present application greatly improves the aperture ratio of the display panel and optimizes the display effect of the display panel.

BRIEF DESCRIPTION OF DRAWINGS

FIG. 5 is a structural diagram of a combined display panel composed of the first sub-screen and the second sub-screen of FIG. 2 and FIG. 5.

DETAILED DESCRIPTION OF PREFERRED EMBODIMENTS

Figure 1:
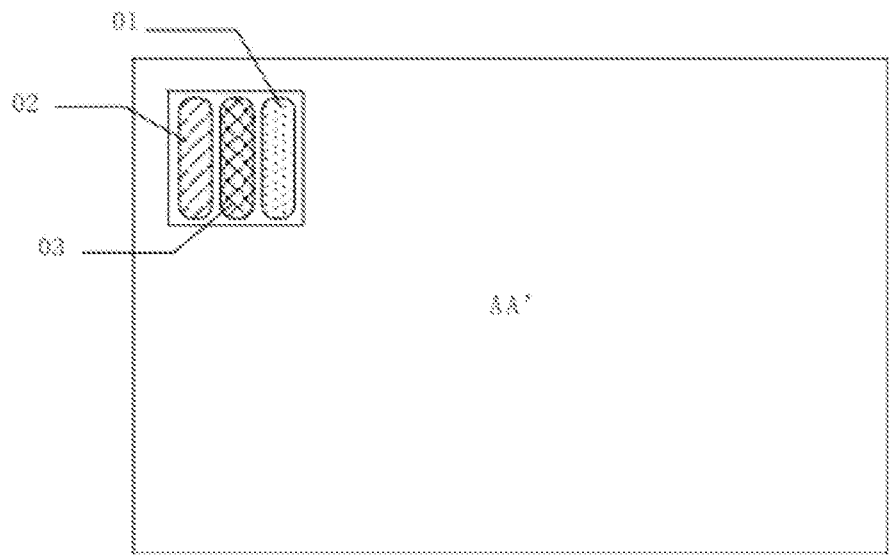
FIG. 1 is a structural diagram of a display panel in the prior art.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

First, the prior art will be briefly described. Referring to FIG. 1, a display panel of the prior art includes a display area AA', which includes a plurality of pixel units. FIG. 1 exemplarily shows a schematic diagram of a pixel unit in which each pixel unit includes a first sub-pixel 01, a second sub-pixel 02, and a third sub-pixel 03. The first sub-pixel 01, the second sub-pixel 02, and the third sub-pixel 03 emit red light, blue light, and green light respectively. When display, each pixel unit can emit only one color of light at the same time, so the aperture ratio of the display panel in the prior art is only about 33%, which needs to be improved.

The present application provides a combined display panel to increase the aperture ratio of the display panel in the prior art.

Figure 2:
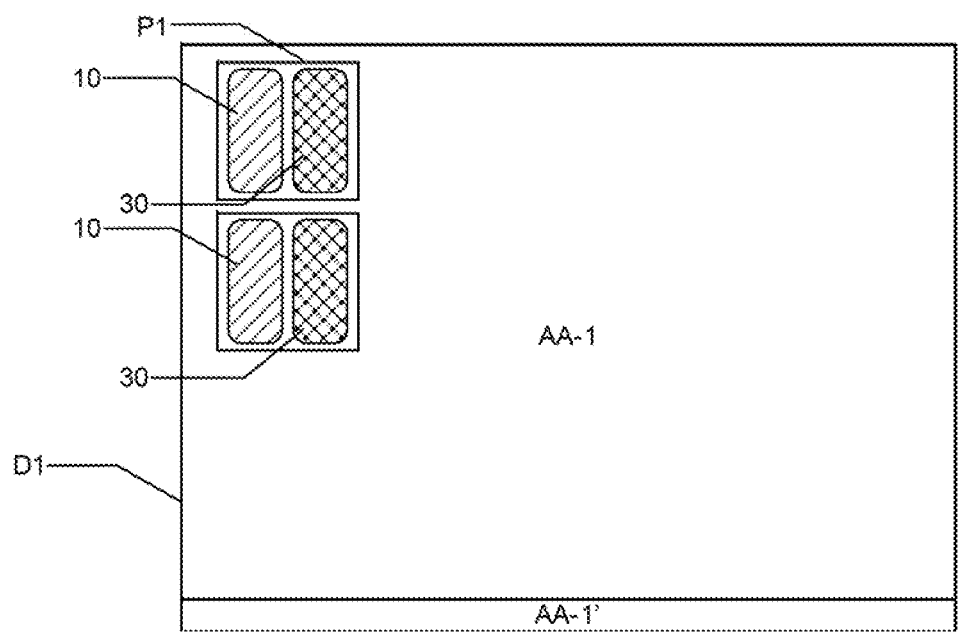
FIG. 2 is a structural diagram of a first sub-screen of a combined display panel in an embodiment of the present application.
Figure 3:
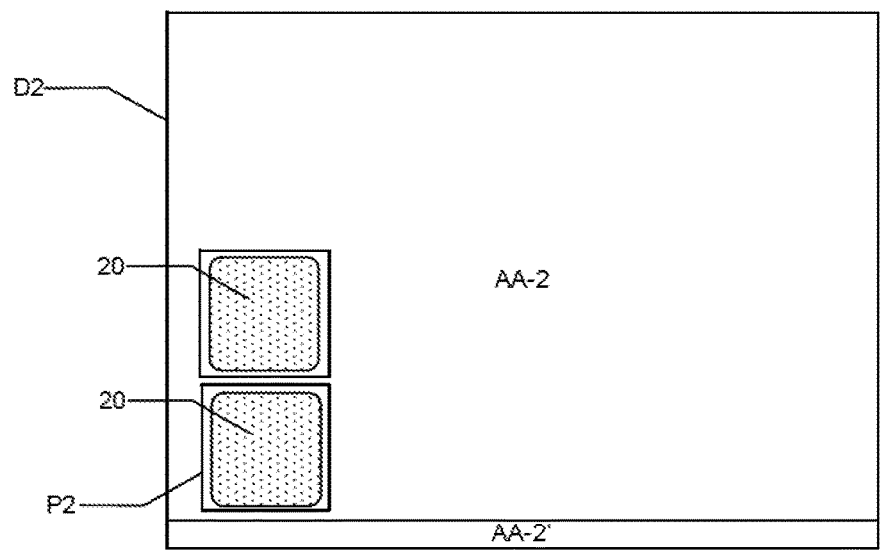
FIG. 3 is a structural diagram of a second sub-screen of the combined display panel in an embodiment of the present application.
Figure 4:
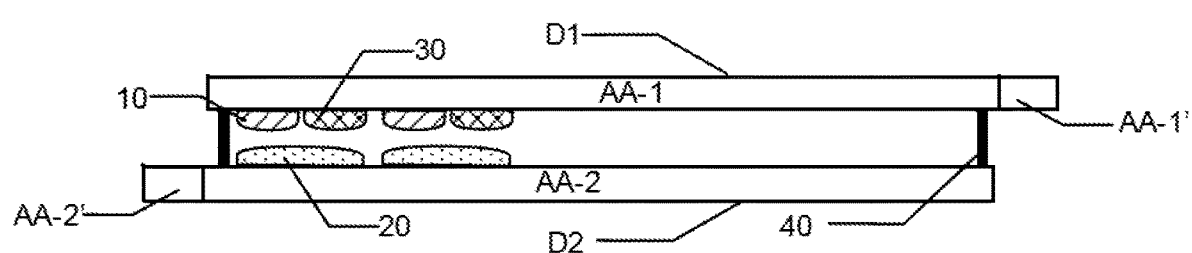
FIG. 4 is a structural diagram of a combined display panel composed of the first sub-screen and the second sub-screen in FIG. 2 and FIG. 3.

Referring to FIG. 2, FIG. 3 and FIG. 4, FIG. 2 is a structural diagram of a first sub-screen of a combined display panel in an embodiment of the present application, FIG. 3 is a structural diagram of a second sub-screen of the combined display panel in an embodiment of the present application, FIG. 4 is a structural diagram of a combined display panel composed of the first sub-screen and the second sub-screen in FIG. 2 and FIG. 3.

The combined display panel in the present application includes a first sub-screen D1 and a second sub-screen D2. Referring to FIG. 2, the first sub-screen D1 includes a plurality of first pixel units P1, and each of the first pixel, units P1 includes a first sub-pixel 10 and a third sub-pixel 30. Referring to FIG. 3, the second sub-screen D2 includes a plurality of second pixel units P2 disposed corresponding to the first pixel unit P1, and each of the second pixel units P2 includes a second sub-pixel 20.

Referring to FIG. 4, the first sub-screen D1 overlaps with the second sub-screen D2, each of the second pixel units P2 is located directly above the first pixel unit corresponding thereto, a first pixel unit and a second pixel unit are stacked to form a pixel unit of the combined display panel.

In this embodiment, in order to enable the first pixel unit P1 and the second pixel unit P2 to completely overlap after the first sub-screen D1 and the second sub-screen D2 are overlapped, the shape and area of the second pixel unit P2 are the same as the shape and area of the first pixel unit P1. In this embodiment, the shapes of the first pixel unit P1 and the second pixel unit P2 are rectangular, but are not limited to other shapes.

In this embodiment, the first sub-pixel 10 is a red pixel, the second sub-pixel 20 is a blue pixel, and the third sub-pixel 30 is a green pixel. An area of the first sub-pixel 10 is equal to an area of the third sub-pixel 30. Due to a wavelength of blue light is shorter than red light and green light, its power consumption is larger, thereby thin film transistors and light emitting diodes in blue pixels are easier aging. In the prior art, since aging speed of the blue pixel is fast, lifetime of the blue pixel determines the life of the display panel. The display panel of the present invention uses the blue pixel as the second sub-pixel 20. The blue pixel occupies the second pixel unit P2 alone so that the aperture ratio of the blue light is close to 100%, which greatly reduces the power consumption of the blue pixel. Therefore, the display panel of the present application significantly slows down the aging of the blue pixels, thereby extending the life of the display panel.

In this embodiment, the first sub-screen D1 is a top illumination display, and the second sub-screen D2 is a two-way illumination display. After constituting a combined display, the second sub-screen D2 is a top illuminated display. The anode of the first sub-screen D1 is a reflective electrode, and the cathode is a transparent electrode. The anode of the second sub-screen D2 is a transparent electrode, and the cathode is a transparent electrode. The reflective electrode can be a metal electrode such as silver, copper, gold or the like having good electrical conductivity and, reflectivity. The transparent electrode can be a transparent conductive material such as indium tin oxide.

In this embodiment, the first sub-screen D1 includes a first display area AA-1 and a first non-display area AA-1'. The plurality of first pixel units P1 are disposed on the first display area AA-1. The first non-display area AA-1' is disposed adjacent to the first display area AA-1 for setting a first control circuit. The first control circuit is configured to control display of the first display area AA-1. The second sub-screen D2 includes a second display area AA-2 and a second non-display area AA-2'. The plurality of second pixel units P2 are disposed on the second display area AA-2, the second non-display area AA-2' is disposed adjacent to the second display area AA-2 for setting a second control circuit. The second control circuit is configured to control display of the second display area AA-2.

In this embodiment, the first sub-screen D1 and the second sub-screen D2 are rectangular. The first non-display area AA-1' is disposed along one side of the first sub-screen D1. The second non-display area AA-2' is disposed corresponding to the first non-display area AA-1' along one side of the second sub-screen D2. The second non-display area AA-2' has a same shape and area as the first non-display area AA-1'. Control signals of the first sub-screen D1 and the second sub-screen D2 are same. Display information received by the first pixel unit P1 and the second pixel unit P2 corresponding thereto is also same.

Referring, to FIG. 2 and FIG. 3, a distribution pattern of the first pixel units P1 on the first sub-screen D1 is axisymmetric with a distribution pattern of the second pixel units P2 on the second sub-screen D2. Referring to FIG. 4, when the first sub-screen D1 and second sub-screen D2 overlapping, the second sub-screen D2 flips over the first sub-screen D1 along a symmetry axis. The two non-display areas of the combined display screen in this embodiment are respectively located on both sides of the display area because there is no block above the non-display area, the first sub-screen D1 and the second sub-screen D2 in this embodiment are easily combined. At the same time, the combined display screen has a relatively small screen ratio.

Figure 5:
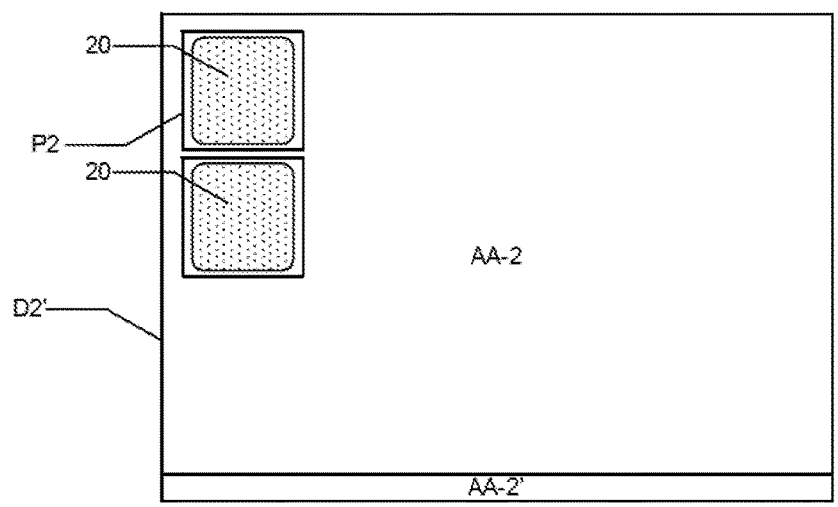
FIG. 5 is a structural diagram of a second sub-screen of a combined display panel according to another embodiment of the present application.
Figure 6:
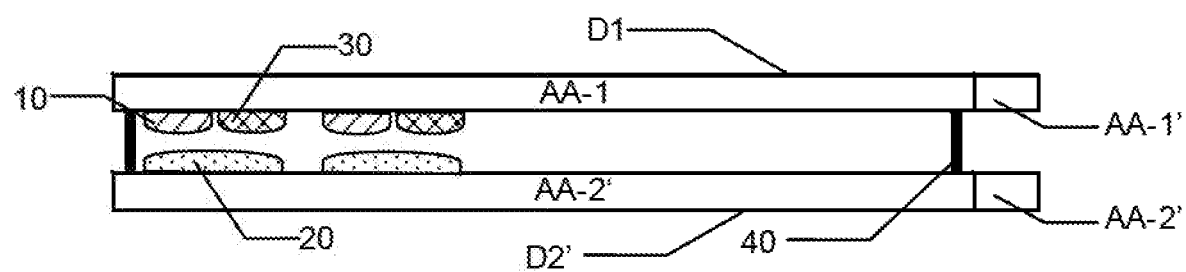

Referring to FIG. 2 and FIG. 5, a distribution pattern of the first pixel, units P1 on the first sub-screen D1 is consistent with a distribution pattern of the second pixel units P2 on the second sub-screen D2, when the first sub-screen D1 and second sub-screen D2 overlapping, the second sub-screen D2 horizontally covers the first sub-screen D1. The two non-display areas of the combined display screen in this embodiment are located on a same side of the display area. Compared with the previous embodiment, the combination of the first sub-screen D1 and the second sub-screen D2 in this embodiment is difficult. However, the screen ratio of the combined display screen in this embodiment is relatively large, and the display effect is better. In practice, an appropriate solution can be selected as needed.

In an embodiment of the present application, the combined display panel further includes a plurality of support columns 40 between the first sub-screen D1 and the second sub-screen D2. Height of the support columns 40 is same. On the one hand, the support columns 40 is used for supporting the second sub-screen D2 to disperse the pressure applied to the first sub-screen D1 by the second sub-screen D2 and prevent the first sub-screen D1 from being cracked due to uneven force. On the other hand, the support columns 40 can ensure that the distance between the first sub-screen D1 and the second sub-screen D2 is kept constant, and avoid pixel cell offset due to a change in distance between the first sub-screen D1 and the second sub-screen D2. Preferably, in order to prevent the support columns 40 from forming a spot or a shadow on the display panel, the material forming the support columns 40 is a white material or a transparent material, and surfaces of the plurality of support pillars 40 have a diffuse reflection structure.

The combined display panel provided by the present application includes a corresponding first sub-screen and a second sub-screen. The first sub-screen includes a plurality of first pixel units, and the second sub-screen includes a plurality of second pixel units disposed corresponding to the first pixel units. Each of the first pixel units includes a first sub-pixel and a third sub-pixel, and each of the second pixel units includes a second sub-pixel. Each of the second pixel units is located directly above the first pixel unit corresponding thereto. With this arrangement, when the first sub-pixel or the third sub-pixel emits light, the aperture ratio of the pixel unit of the combined display panel approaches 50%. When the second sub-pixel emits light, the aperture ratio of the pixel unit of the combined display panel approaches 100%. Therefore, the present application greatly improves the aperture ratio of the display panel and optimizes the display effect of the display panel.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:
1. A combined display panel comprising:
a first sub-screen comprising a plurality of first pixel units, each of the first pixel units comprising a first sub-pixel and a third sub-pixel;
a second sub-screen comprising a plurality of second pixel units corresponding to the first pixel units, each of the second pixel units comprising a second sub-pixel;
wherein the first sub-screen overlaps with the second sub-screen, each of the second pixel units is located directly above one of the first pixel units corresponding thereto, one of the first pixel units and one of the second pixel units are stacked to form a pixel unit of the combined display panel;

wherein the first sub-screen comprises a first display area and a first non-display area, the first pixel units are disposed on the first display area, the first non-display area is disposed adjacent to the first display area for setting a first control circuit;

wherein the second sub-screen comprises a second display area and a second non-display area, the second pixel units are disposed on the second display area, the second non-display area is disposed adjacent to the second display area for setting a second control circuit.

2. The combined display panel according to claim 1, wherein a shape and an area of each of the second pixel units are same as a shape and an area of each of the first pixel units.

3. The combined display panel according to claim 2, wherein an area of the first sub-pixel is equal to an area of the third sub-pixel.

4. The combined display panel according to claim 3, wherein the first sub-pixel is a red pixel, the second sub-pixel is a blue pixel, and the third sub-pixel is a green pixel.

5. The combined display panel according to claim 1, wherein the first sub-screen is a top illumination display and the second sub-screen is a two-way illumination display.

6. The combined display panel according to claim 5, wherein, an anode of the first sub screen is a reflective electrode, and a cathode of the first sub-screen is a transparent electrode;

wherein an anode of the second sub-screen is a transparent electrode, and a cathode of the second sub-screen is a transparent electrode.

7. The combined display panel according to claim 1, wherein the first sub-screen and the second sub-screen are rectangular;

wherein the first non-display area is disposed along a side of the first sub-screen;

wherein the second non-display area is disposed corresponding to the first non-display area along a side of the second sub-screen, the second non-display area has a same shape and area as the first non-display area.

8. A combined display panel comprising:

a first sub-screen comprising a plurality of first pixel units, each of the first pixel units comprising a first sub-pixel and a third sub-pixel;

a second sub-screen comprising a plurality of second pixel units corresponding to the first pixel units, each of the second pixel units comprising a second sub-pixel;

wherein the first sub-screen overlaps with the second sub-screen, each of the second pixel units is located directly above one of the first pixel units corresponding thereto, one of the first pixel units and one of the second pixel units are stacked to form a pixel unit of the combined display panel.

9. The combined display panel according to claim 8, wherein a shape and an area of each of the second pixel units are same as a shape and an area of each of the first pixel units.

10. The combined display panel according to claim 9, wherein an area of the first sub-pixel is equal to an area of the third sub-pixel.

11. The combined display panel according to claim 10, wherein the first sub-pixel is a red pixel, the second sub-pixel is a blue pixel, and the third sub-pixel is a green pixel.

12. The combined display panel according to claim 8, wherein the first sub-screen is a top illumination display and the second sub-screen is a two-way illumination display.

13. The combined display panel according to claim 12, wherein, an anode of the first sub-screen is a reflective electrode, and a cathode of the first sub-screen is a transparent electrode;

wherein an anode of the second sub-screen is a transparent electrode, and a cathode of the second sub-screen is a transparent electrode.

14. The combined display panel according to claim 8, wherein the first sub-screen comprises a first display area and a first non-display area, the first pixel units are disposed on the first display area, the first non-display area is disposed adjacent to the first display area for setting a first control circuit;

wherein the second sub-screen comprises a second display area and a second non-display area, the second pixel units are disposed on the second display area, the second non-display area is disposed adjacent to the second display area for setting a second control circuit.

15. The combined display panel according to claim 14, wherein a distribution pattern of the first pixel units on the first sub-screen is axisymmetric with a distribution pattern of the second pixel units on the second sub-screen, when the first sub-screen and second sub-screen overlapping, the second sub-screen flips over the first sub-screen along a symmetry axis.

16. The combined display panel according to claim 14, wherein a distribution pattern of the first pixel units on the first sub-screen is consistent with a distribution pattern of the second pixel units on the second sub-screen, when the first sub-screen and second sub-screen overlapping, the second sub-screen horizontally covers the first sub-screen.

17. The combined display, panel according to claim 8, wherein the first sub-screen and the second sub-screen are rectangular;

wherein the first non-display area is disposed along a side of the first sub-screen;

wherein the second non-display area is disposed corresponding to the first non-display area along a side of the second sub-screen, the second non-display area has a same shape and area as the first non-display area.

18. The combined display panel according to claim 8, wherein control signals of the first sub-screen and the second sub-screen are same, and display information received by the first pixel units and the corresponding second pixel units is same.

19. The combined display panel according to claim 8, wherein the combined display panel further comprises a plurality of support columns between the first sub-screen and the second sub-screen.

20. The combined display panel according to claim 19, wherein a material forming the support columns is a white material or a transparent material, and a surface of the support columns has a diffuse reflection structure.

* * * * *